United States Patent
Kondo et al.

(10) Patent No.: US 9,368,892 B2
(45) Date of Patent: Jun. 14, 2016

(54) CONNECTOR AND CONTACT

(71) Applicant: FUJITSU COMPONENT LIMITED, Tokyo (JP)

(72) Inventors: Takahiro Kondo, Tokyo (JP); Yasuyuki Miki, Tokyo (JP); Koki Sato, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 14/693,972

(22) Filed: Apr. 23, 2015

(65) Prior Publication Data

US 2015/0311614 A1  Oct. 29, 2015

(30) Foreign Application Priority Data

Apr. 24, 2014  (JP) .................................. 2014-090556

(51) Int. Cl.

| | |
|---|---|
| *H01R 4/66* | (2006.01) |
| *H01R 12/79* | (2011.01) |
| *H01R 12/52* | (2011.01) |
| *H01R 13/03* | (2006.01) |
| *H01R 13/6473* | (2011.01) |
| *H01R 12/77* | (2011.01) |

(Continued)

(52) U.S. Cl.
CPC ................. *H01R 12/79* (2013.01); *H01R 12/52* (2013.01); *H01R 12/775* (2013.01); *H01R 13/035* (2013.01); *H01R 13/6473* (2013.01); *H01R 13/6585* (2013.01); *H05K 1/05* (2013.01); *H05K 1/117* (2013.01); *H05K 2201/09172* (2013.01)

(58) Field of Classification Search
CPC ...... H01R 12/52; H01R 12/79; H01R 12/775; H01R 13/03; H01R 13/035; H01R 13/6473; H01R 13/6585; H01R 13/65805; H01R 9/07; H01R 9/0714; H01R 12/73; H01R 12/737; H01R 13/652; H05K 2201/09172; H05K 1/117; H05K 1/05
USPC ............ 439/733.1, 67–73, 77, 591, 637, 886, 439/931, 942, 108; 361/748, 749, 760
See application file for complete search history.

(56) References Cited

U.S. PATENT DOCUMENTS

| | | | | |
|---|---|---|---|---|
| 4,662,702 | A | * | 5/1987 | Furuya ................... H01R 13/03 439/630 |
| 5,163,835 | A | * | 11/1992 | Morlion ................. H01R 13/03 439/108 |

(Continued)

FOREIGN PATENT DOCUMENTS

JP 2003-142183 5/2003

*Primary Examiner* — Neil Abrams
*Assistant Examiner* — Travis Chambers
(74) *Attorney, Agent, or Firm* — IPUSA, PLLC

(57) ABSTRACT

A connector includes a terminal including a base, first extension parts that extend from the base toward a first end of the connector and second extension parts that extend from the base toward a second end of the connector; an insulating layer formed on the terminal; a signal line that is formed on the insulating layer and extends from an end of one of the first extension parts to an end of one of the second extension parts, the signal line being connected to a signal wire of a board; and a ground line that is formed on the insulating layer, is electrically connected to the terminal, and extends from an end of another one of the first extension parts to an end of another one of the second extension parts, the ground line being connected to a ground wire of the board.

7 Claims, 13 Drawing Sheets

(51) Int. Cl.
*H01R 13/6585* (2011.01)
*H05K 1/05* (2006.01)
*H05K 1/11* (2006.01)

(56) References Cited

U.S. PATENT DOCUMENTS

| | | | |
|---|---|---|---|
| 5,237,743 A | 8/1993 | Busacco et al. | |
| 5,248,262 A * | 9/1993 | Busacco | H05K 7/1069 |
| | | | 439/493 |
| 5,277,592 A * | 1/1994 | Morlion | H01R 13/03 |
| | | | 439/108 |
| 5,399,101 A * | 3/1995 | Campbell | H01R 13/2464 |
| | | | 439/482 |
| 5,743,749 A * | 4/1998 | Kurakane | H05K 7/1023 |
| | | | 439/71 |
| 6,120,306 A * | 9/2000 | Evans | H01R 23/688 |
| | | | 439/101 |
| 6,758,696 B2 * | 7/2004 | Farnworth | H01L 25/0657 |
| | | | 439/632 |
| 6,796,822 B2 * | 9/2004 | Sato | H01R 12/87 |
| | | | 439/260 |
| 7,011,556 B2 | 3/2006 | Miyazawa et al. | |
| 7,614,884 B2 * | 11/2009 | Kuwahara | H01L 23/49827 |
| | | | 439/591 |
| 7,862,349 B1 * | 1/2011 | Takahashi | H01R 13/2407 |
| | | | 439/591 |
| 8,007,316 B2 * | 8/2011 | Costello | H01R 13/04 |
| | | | 439/607.1 |
| 2005/0239300 A1 | 10/2005 | Yasumura et al. | |
| 2007/0000685 A1 | 1/2007 | Inoue | |

* cited by examiner

FIG.1A
FIG.1B
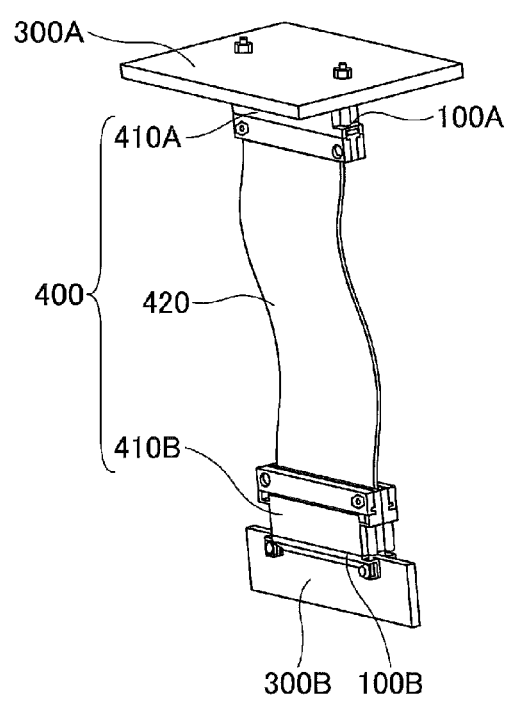
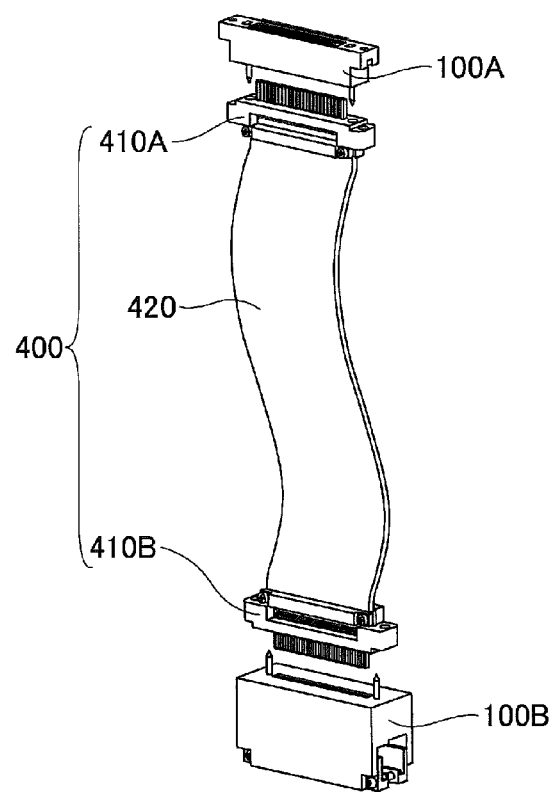

FIG.2A
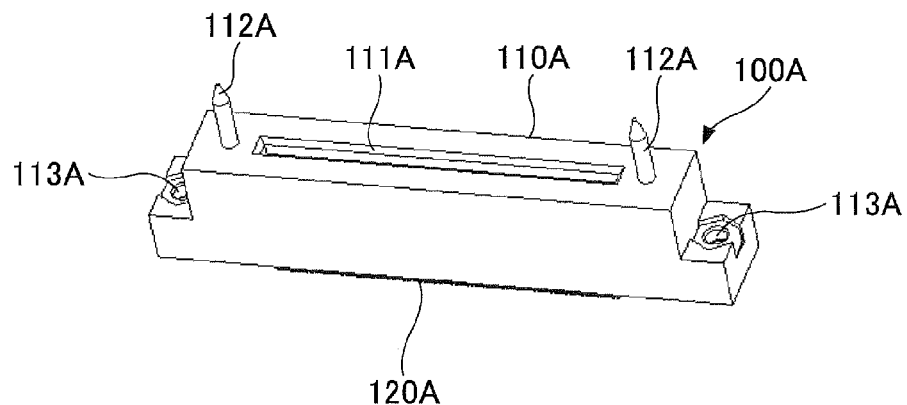
FIG.2B  FIG.2C
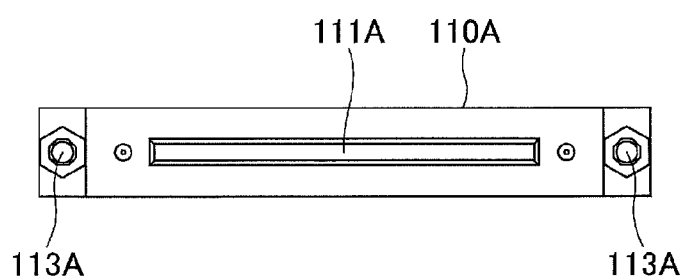 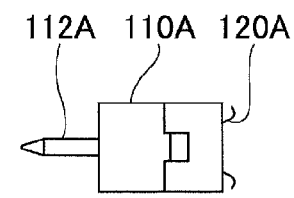
FIG.2D
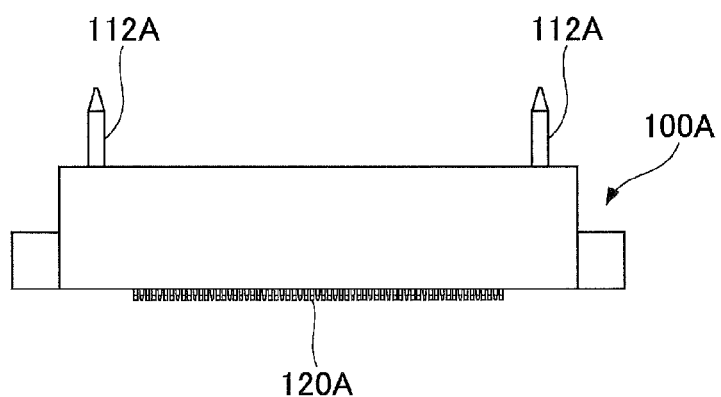

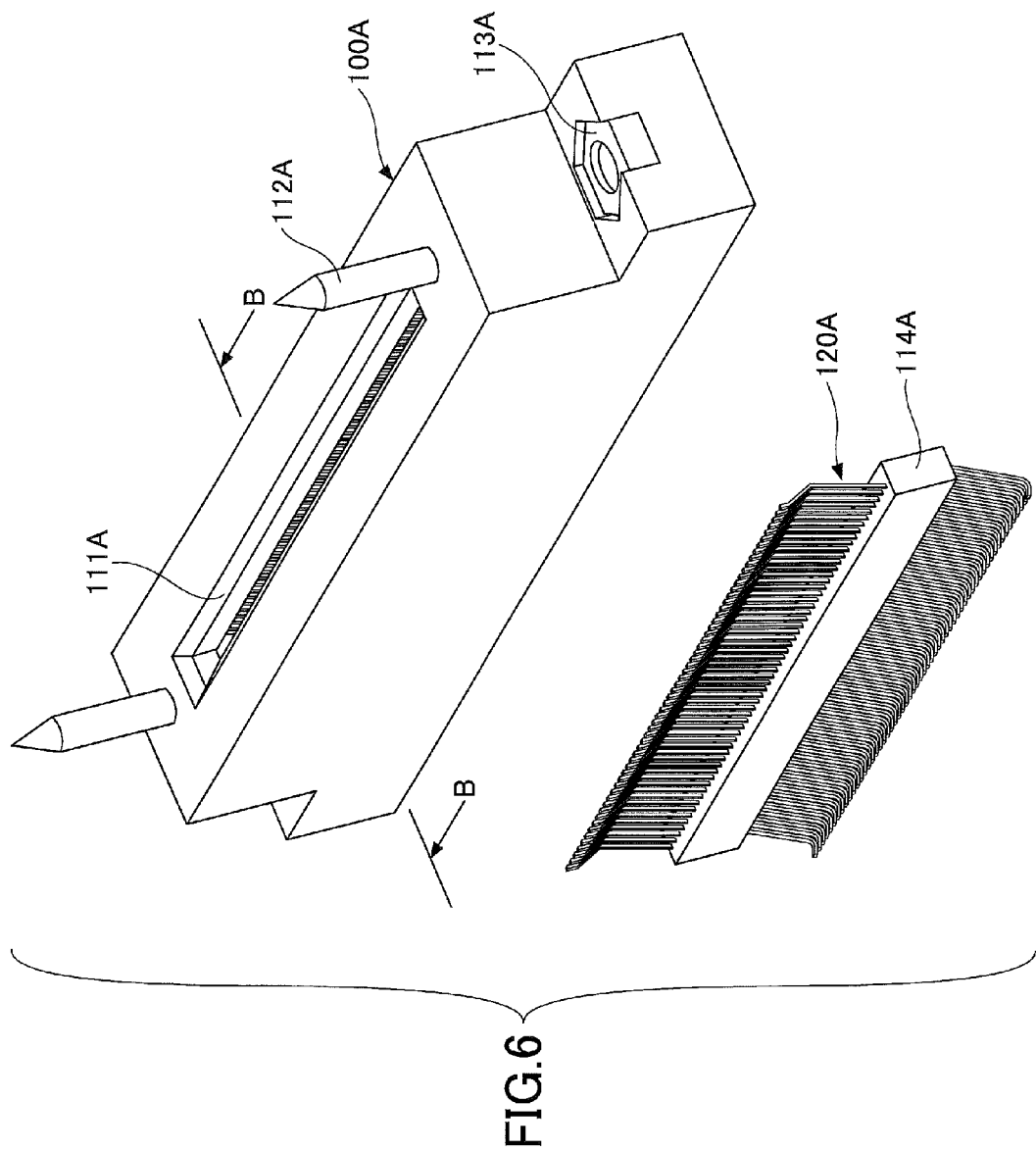

FIG.8A
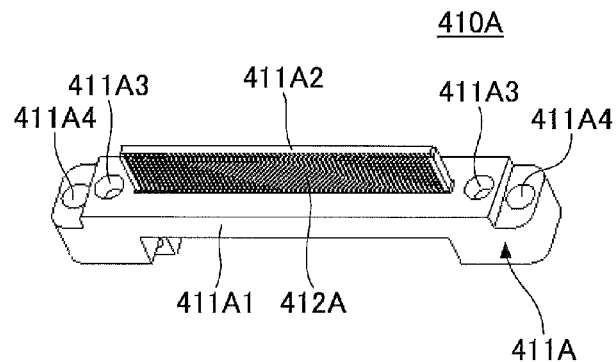
FIG.8B
FIG.8C
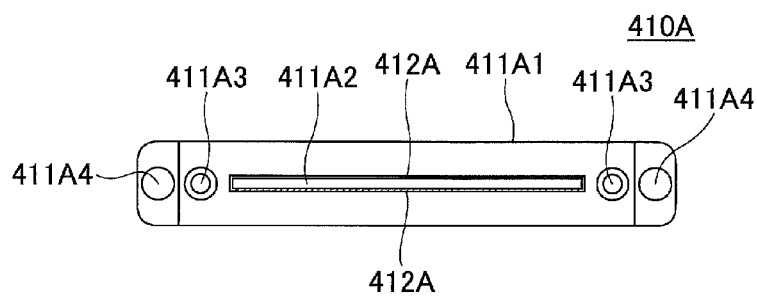 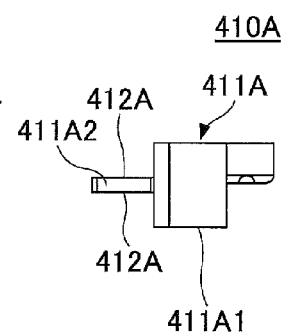
FIG.8D
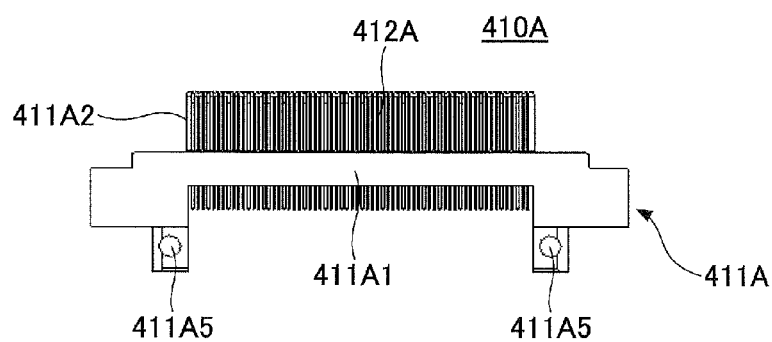

FIG.11A
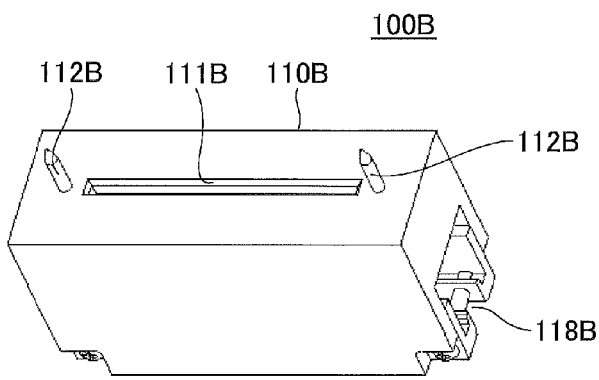
FIG.11B
FIG.11C
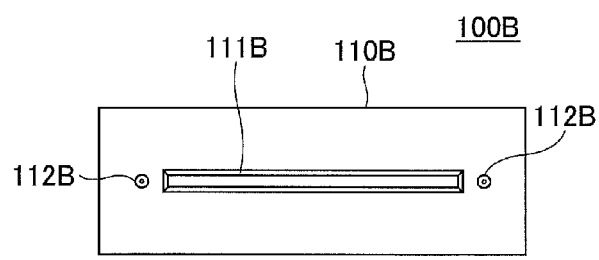 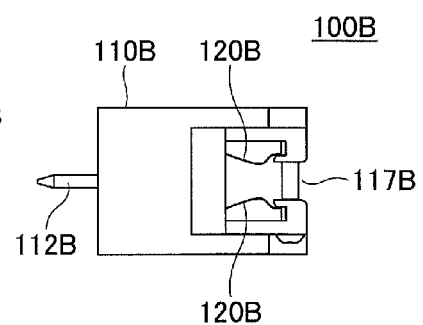
FIG.11D
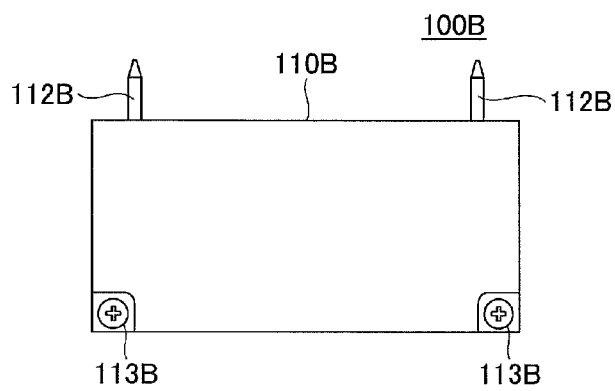

CONNECTOR AND CONTACT

CROSS-REFERENCE TO RELATED APPLICATION

The present application is based upon and claims the benefit of priority of Japanese Patent Application No. 2014-090556, filed on Apr. 24, 2014, the entire contents of which are incorporated herein by reference.

BACKGROUND OF THE INVENTION

1. Field of the Invention

An aspect of this disclosure relates to a connector and a contact.

2. Description of the Related Art

Japanese Laid-Open Patent Publication No. 2003-142183, for example, discloses a contact module that includes a sheet made of a metal, an insulating film formed on at least one surface of the sheet, and a contact formed as a thin film of a noble metal on the insulating film and including contact points and a circuit pattern.

However, in the disclosed contact module, the impedance of the sheet made of a metal is not matched sufficiently with the impedance of the contact formed on the insulating film on the sheet. Therefore, with the disclosed contact module, it may be difficult to transmit a signal in an impedance matched condition.

SUMMARY OF THE INVENTION

An object of the invention is to provide a connector and a contact that may transmit signal in an impedance matched condition. In an aspect of the invention, there is provided a connector to be connected to a signal wire and a ground wire formed on a board. The connector includes a base made of a conductive material, at least two first extension parts that extend from the base toward a first end of the connector, and at least two second extension parts that extend from the base toward a second end of the connector; an insulating layer formed on a surface of the terminal; a signal line that is formed on the insulating layer, is insulated from the terminal, and extends from an end of a first one of the first extension parts to an end of a first one of the second extension parts, the signal line being connected to the signal wire of the board when the connector is attached to the board; and a ground line that is formed on the insulating layer, is electrically connected to the terminal, and extends from an end of a second one of the first extension parts, which is adjacent to the first one of the first extension parts, to an end of a second one of the second extension parts, which is adjacent to the first one of the second extension parts, the ground line being connected to the ground wire of the board when the connector is attached to the board.

BRIEF DESCRIPTION OF THE DRAWINGS

FIGS. 1A and 1B are drawings illustrating connectors;

FIGS. 2A through 2D are drawings illustrating a connector;

FIG. 6 is a drawing illustrating a connector;

FIGS. 8A through 8D are drawings illustrating a connector of an FPC assembly;

FIGS. 11A through 11D are drawings illustrating a connector;

DESCRIPTION OF EMBODIMENTS

Embodiments of the present invention are described below with reference to the accompanying drawings.

FIGS. 1A and 1B are drawings illustrating connectors 100A and 100B according to an embodiment. As illustrated by FIG. 1A, the connector 100A is attached to a board 300A, and the connector 100B is attached to a board 300B.

Each of the boards 300A and 300B includes signal lines and ground lines. The characteristic impedance of the signal lines and the ground lines of the boards 300A and 300B is set at a predetermined value (e.g., 50Ω) to enable high-speed signal transmission at, for example, about 2.0 Gbps.

The signal lines and the ground lines of the boards 300A and 300B with such a characteristic impedance may be implemented by microstrip lines or coplanar lines. The connector 100A is connected to the signal lines and the ground lines of the board 300A, and the connector 100B is connected to the signal lines and the ground lines of the board 300B.

A flexible printed circuit (FPC) assembly 400 includes connectors 410A and 410B and two FPCs 420. Each of the FPCs 420 includes signal lines and ground lines.

The characteristic impedance of the signal lines and the ground lines of the FPCs 420 is set at a predetermined value (e.g., 50Ω) to enable high-speed signal transmission at, for example, about 2.0 Gbps. The connector 410A is connected to first ends of the FPCs 420, and the connector 410B is connected to second ends of the FPCs 420.

In FIG. 1B, the connectors 410A and 410B of the FPC assembly 400 are connected to the corresponding connectors 100A and 100B.

Figure 3:
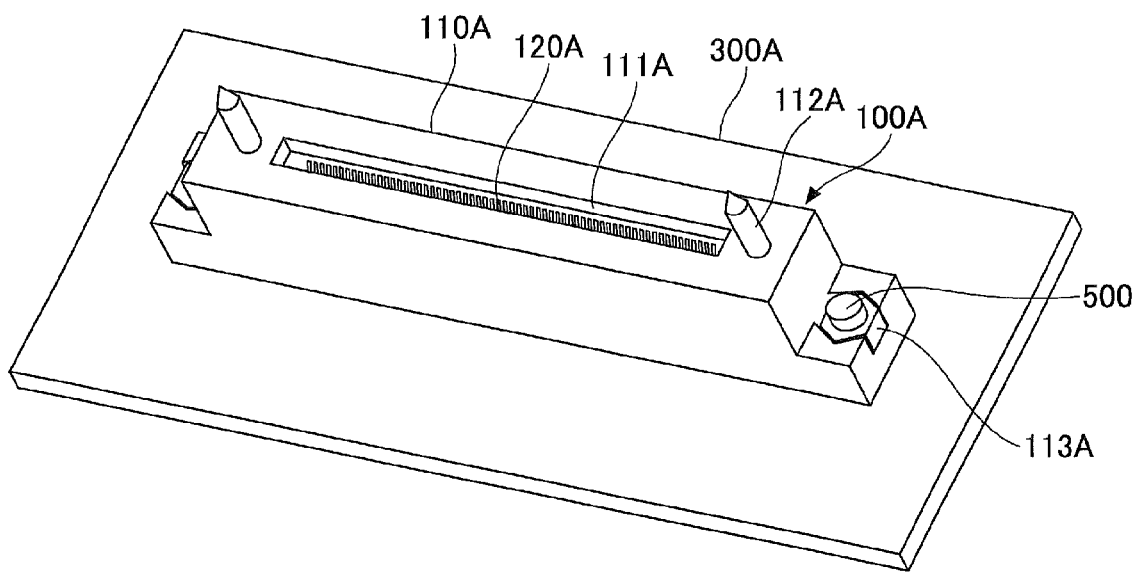
FIG. 3 is a perspective view of a connector attached to a board.

FIG. 2A is a perspective view, FIG. 2B is a front view, FIG. 2C is a side view, and FIG. 2D is a plan view of the connector 100A. FIG. 3 is a perspective view of the connector 100A attached to the board 300A.

The connector 100A includes a housing 110A and contacts 120A. The connector 100A is formed by placing the contacts 120A in a through hole 111A of the housing 110A. The housing 110A includes guide pins 112A used when the connector 410A is attached to the connector 100A. A bottom of each guide pin 112A is embedded in the body of the housing 110A. The housing 110A also includes screw holes 113A.

Through holes corresponding to the screw holes 113A are formed in the board 300A. The screw holes 113 of the housing 110A are aligned with the through holes of the board 300A, and the connector 100A is attached to one surface of the board 300A with screws 500 inserted into the screw holes 113A and the through holes of the board 300A as illustrated by FIG. 1A and FIG. 3. For example, the guide pins 112A may be comprised of a metal such as copper or nickel, or a resin.

The housing 110A may be comprised of an insulating material such as an epoxy resin. The housing 110A may have a cuboid shape, and includes protrusions protruding in the longitudinal direction of the housing 110A. The screw holes 113A are formed in the protrusions of the housing 110A.

Each contact 120A includes a first end and a second end, and extends in a direction that is substantially perpendicular to a surface of the board 300A. The second end of the contact 120A to be connected to the board 300A is illustrated in FIGS. 2A, 2C, and 2D, and the first end of the contact 120A is illustrated in FIG. 3. The first end of the contact 120A is connected to the connector 410A of the FPC assembly 400, and the second end of the contact 120A is connected to the signal line and the ground lines of the board 300A.

Figure 4A:
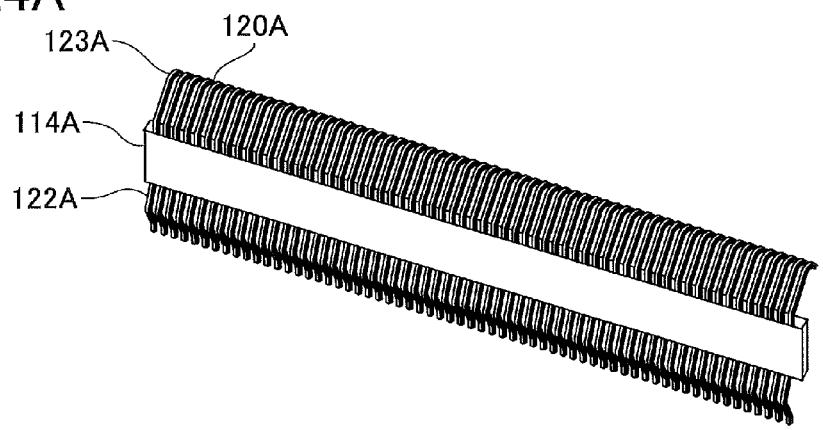
FIGS. 4A through 4C are drawings illustrating contacts.
Figure 4B:
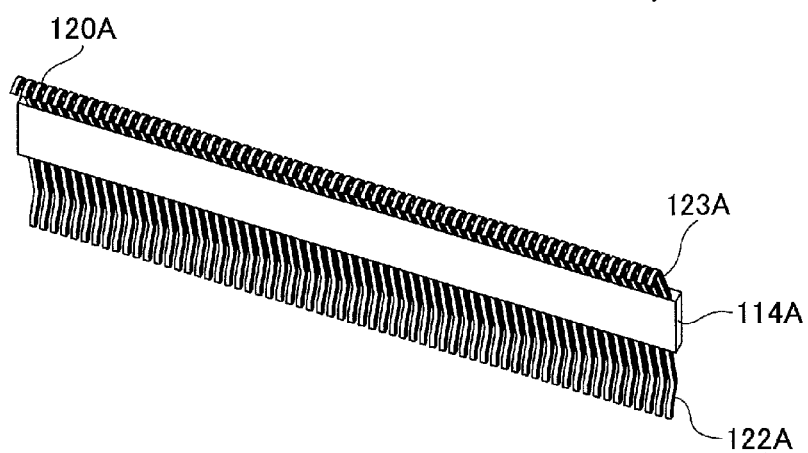
Figure 4C:
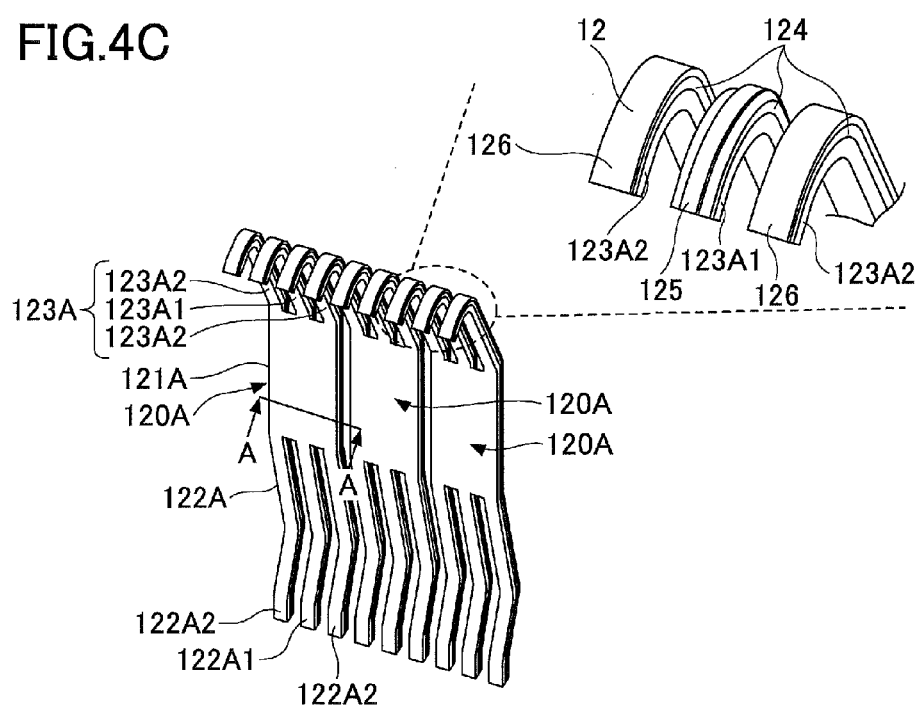
Figure 5A:
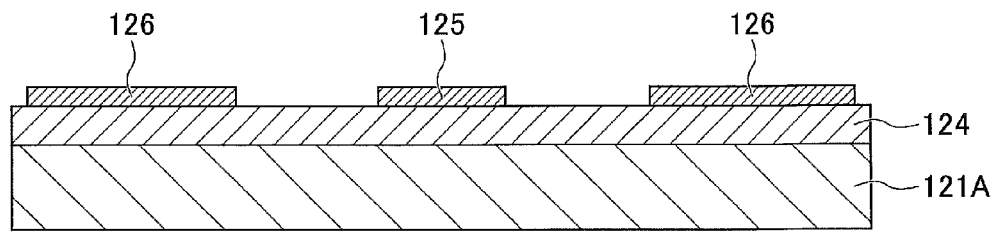
FIGS. 5A through 5C are cross-sectional views taken along line A-A of FIG. 4C.
Figure 5B:
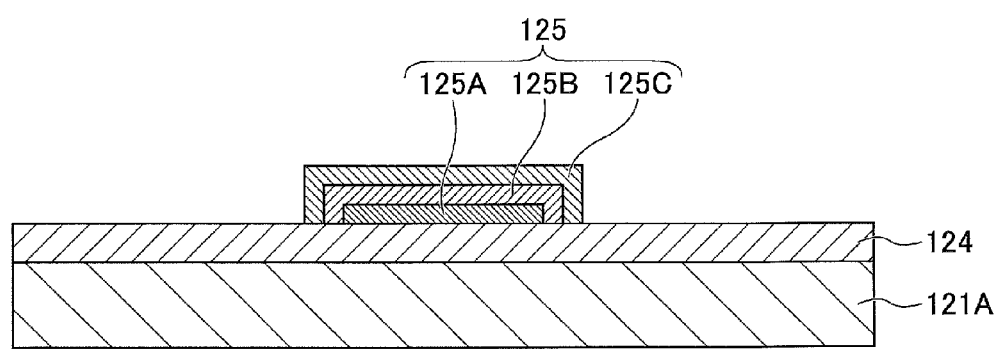
Figure 5C:
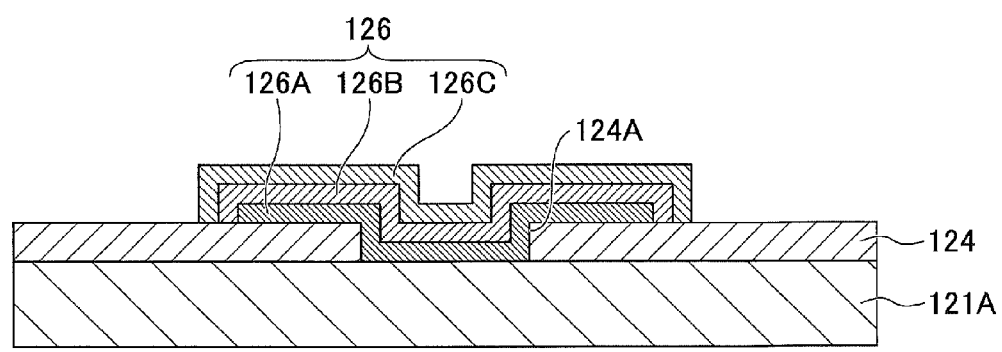

FIGS. 4A and 4B are perspective views and FIG. 4C is an enlarged view of the contact 120A. FIG. 5A is a cross-sectional view taken along line A-A of FIG. 4C, and FIGS. 5B and 5C are enlarged views of parts of FIG. 5A.

The contact 120A is a linear leaf spring. As illustrated by FIGS. 4A and 4B, twenty-two contacts 120A are bound together with a holder 114A. Each contact 120A includes leaf spring structures that protrude from the holder 114A in opposite directions. The holder 114A is a part of the housing 110A (see FIGS. 2A-2D and FIG. 3), and is disposed inside of the housing 110A. The internal configuration of the housing 110A is described later with reference to FIG. 7.

FIG. 4C illustrates contacts 120A arranged adjacent to each other. FIG. 4C also includes an enlarged view of an end portion of one of the contacts 120A.

The contacts 120A bound together with the holder 114A as illustrated by FIGS. 4A and 4B are arranged as illustrated by FIG. 4C. In FIG. 4C, three of the twenty-two contacts 120A are illustrated as an example, and the holder 114A is omitted.

Each contact 120A includes a base 121A, extension parts 122A, extension parts 123A, an insulating layer 124, a signal line 125, and two ground lines 126.

The base 121A, the extension part 122A, and the extension part 123A are formed integrally as a single component that is an example of a ground terminal. The base 121A, the extension part 122A, and the extension part 123A may be formed, for example, by punching sheet metal made of, for example, stainless steel and bending the punched sheet metal.

The insulating layer 124, the signal line 125, and the ground lines 126 are formed on the ground terminal, that is, on the base 121A, the extension part 122A, and the extension part 123A.

The base 121A is a plate-like part. The extension parts 122A and 123A extend from the corresponding ends of the base 121A in the length direction. The insulating layer 124 is formed on one surface of the base 121A, and the signal line 125 and the ground lines 126 are formed on the insulating layer 124.

The extension part 122A extends from one end (the lower end in FIG. 4C) of the base 121A and branches into three extension parts, one extension part 122A1 in the middle and two extension parts 122A2 provided on the sides of the extension part 122A1.

On the extension part 122A1, the signal line 125 is formed on the insulating layer 124. On the extension parts 122A2, the ground lines 126 are formed on the insulating layer 124. The signal line 125 and the ground lines 126 formed on the extension part 122A are connected to the signal line 125 and the ground lines 126 formed on the base 121A.

In FIG. 4C, although the insulating layer 124, the signal line 125, and the ground lines 126 formed on the back side of the extension part 122A are not visible, their configurations are substantially the same as those of the insulating layer 124, the signal line 125, and the ground lines 125 formed on the extension part 123A.

The signal line 125 and the ground lines 126 formed on the extension part 122A are to be connected to the connector 410A (see FIGS. 1A and 1B).

As illustrated by FIGS. 4A and 4B, two sets of the contacts 120A are used in the present embodiment. A conductive part of the connector 410A is inserted between the signal lines 125 and the ground lines 126 of the extension parts 122A of a first set of the contacts 120A and the signal lines 125 and the ground lines 126 of the extension parts 122A of a second set of the contacts 120A, and the connector 100A and the connector 410A are electrically connected to each other. To be able to sandwich the conductive part of the connector 410A between pairs of the contacts 120A, the extension part 122A has a leaf spring structure. The leaf spring structure of the extension part 122A is configured such that an elastic force acts in such a direction that a distance between a pair of opposing extension parts 122A is reduced.

The extension part 123A extends from another end (the upper end in FIG. 4C) of the base 121A and branches into three extension parts, an extension part 123A1 in the middle and two extension parts 123A2 on the sides of the extension part 123A1.

On the extension part 123A1, the signal line 125 is formed on the insulating layer 124. On the extension parts 123A2, the ground lines 126 are formed on the insulating layer 124. The signal line 125 and the ground lines 126 formed on the extension part 123A are connected to the signal line 125 and the ground lines 126 formed on the extension part 122A via the signal line 125 and the ground lines 126 formed on the base 121A.

The signal line 125 and the ground lines 126 formed on the extension part 123A are to be connected to the corresponding signal line and ground lines on the board 300A.

The extension part 123A has a leaf spring structure whose end portion has a curved shape. When the curved end portion is pressed toward the base 121A, the extension part 123A elastically bends and a restoring force is generated. This leaf spring structure enables reliable electrical connection between the end of the extension part 123A and the signal line and the ground lines of the board 300A.

FIG. 5A illustrates the insulating layer 124, the signal line 125, and the ground lines 126 formed on one surface of the base 121A. As described above, the insulating layer 124 is formed on the base 121A, the extension part 122A, and the extension part 123A. Also, the signal line 125 and the ground lines 126 are formed continuously on the base 121A, the extension part 122A, and the extension part 123A via the insulating layer 124.

FIG. 5A illustrates a cross section of the base 121A on which the insulating layer 124, the signal line 125, and the ground lines 126 are formed. A cross section of each of the extension part 122A and the extension part 123A may be obtained by dividing the cross section of FIG. 5A into three sections in the horizontal direction.

The insulating layer 124 may be implemented by, for example, a polyimide film. The insulating layer 124 is pasted onto the base 121A, the extension part 122A, and the extension part 123A.

As illustrated by FIG. 5B, the signal line 125 includes a Cu plated layer 125A, an Ni plated layer 125B, and an Au plated layer 125C. The signal line 125 may be formed on the insulating layer 124 by a plating process.

As illustrated by FIG. 5C, a groove 124A is formed in a part of the insulating layer 124 below the ground line 126. The groove 124A passes through the insulating layer 124 in the thickness direction, and extends from one end to the other end of the ground line 126 in the length direction.

The ground line 126 includes a Cu plated layer 126A, an Ni plated layer 126B, and an Au plated layer 126C. The ground line 126 may be formed on the insulating layer 124 by a plating process.

Because the Cu plated layer 126 is formed along the groove 124A, the ground line 126 is physically and electrically connected to the base 121A, the extension part 122A, and the extension part 123A that function as a ground terminal. Accordingly, the ground line 126 is kept at a ground potential.

In the present embodiment, the groove 124A formed in the insulating layer 124 extends continuously from one end to the other end of the ground line 126. Alternatively, the groove 124A may be formed to extend intermittently from one end to the other end of the ground line 126. Through holes passing through the insulating layer 124 may be formed at predetermined intervals along the ground line 126 instead of the groove 124A.

Upper parts of the signal line 125 and the ground lines 126 not to be connected to the conductive part of the connector 410A may be covered with a protective film. The protective film may be implemented by, for example, a polyimide film.

With the above configuration, the base 121A, the extension part 122A, and the extension part 123A of the contact 120A function as a ground terminal that is kept at a ground potential. Accordingly, the signal line 125, the base 121A, the extension part 122A, and the extension part 123A form a microstrip line.

The ground lines 126 are formed on the sides of the signal line 125 at the same height as and parallel to the signal line 125. Accordingly, the signal line 125 and the ground lines 126 form a coplanar line.

The contact 120A is configured as described above to achieve good impedance matching between the board 300A and the connector 410A, to reduce reflection and transmission loss of a signal, and to improve signal transmission characteristics.

With the above configuration, the characteristic impedance of the signal line 125 of the contact 120A can be set at a predetermined value (e.g., 50Ω).

Next, the housing 110A of the connector 100A is described with reference to FIGS. 6 and 7.

Figure 7:
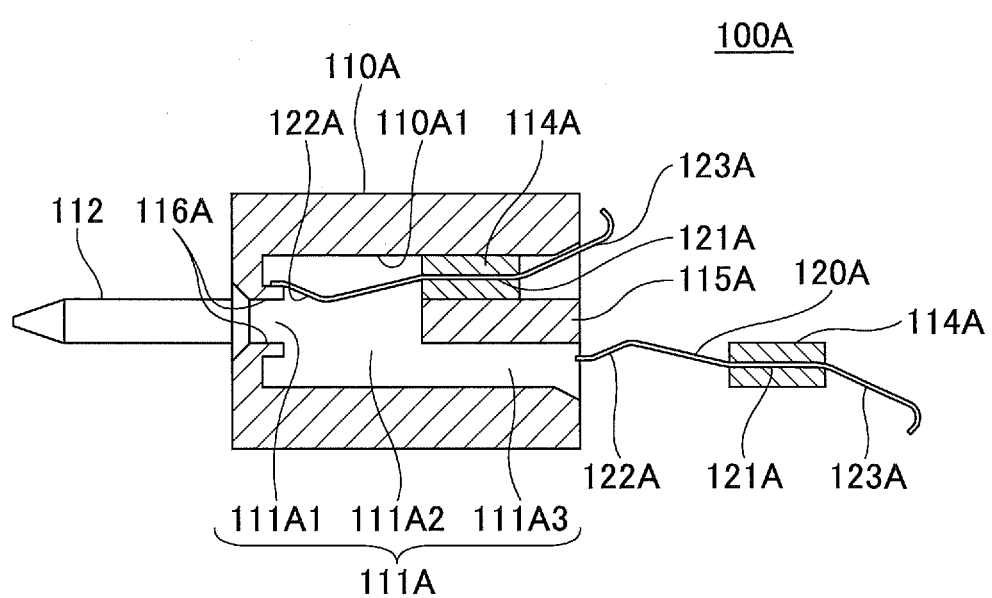
FIG. 7 is a drawing illustrating a connector.

FIGS. 6 and 7 illustrate the connector 100A. FIG. 7 is a cross-sectional view taken along line B-B of FIG. 6.

Two sets of twenty-two contacts 120A bound together with the holder 114A are placed in the housing 110A of the connector 100A. In FIG. 6, one set of the contacts 120A is outside of the housing 110A. The holder 114A may be implemented as a resin part that is formed by insert molding to hold the bases 121A of the contacts 120A together. As another example, the holder 114A may be implemented as a V-shaped part including two arm parts that are joined at one end. The arm parts are placed to sandwich the bases 121A of the contacts 120A, and are then joined at the other end to hold the contacts 120A together.

As illustrated by FIG. 7, the through hole 111A of the housing 110A includes an opening 111A1, a middle portion 111A2, and an opening 111A3. The opening 111A1 is formed between the guide pins 112A as indicated by the reference number 111A in FIG. 6.

The opening 111A3 is divided into two openings by a partition wall 115A of the housing 110A. In FIG. 7, the holder 114A of one set of the contacts 120A is fitted into the upper opening of the opening 111A3. The gap between an inner wall 110A1 of the housing 110A and the partition wall 115A is set at a value that is substantially the same as the thickness of the holder 114A so that the holder 114A can be fitted into the gap.

The housing 110A also includes two engaging parts 116A at the boundary between the opening 111A1 and the middle portion 111A2. The engaging parts 116A are formed to extend along the length direction of the opening 111A1, and to protrude into the middle portion 111A2.

When the contacts 120A bound by the holder 114A are inserted through the opening 111A3 into the through hole 111A and the holder 114A is fitted into the gap between the inner wall 110A1 and the partition wall 115A, the end of the extension part 122A of each of the contacts 120A engages with the corresponding engaging part 116A.

With the end of the extension part 122A engaging with the engaging part 116A and the holder 114A holding the base 121A fitted into the gap between the inner wall 110A1 and the partition wall 115, the extension part 122A can function as a leaf spring.

In FIG. 7, the other set of the contacts 120A is still outside of the housing 110A. When the other set of the contacts 120A is also placed in the housing 110A, the corresponding extension parts 122A of the two sets of the contacts 120A face each other, and the signal lines 125 and the ground lines 126 formed on the corresponding extension parts 122A also face each other. When the conductive part of the connector 410A is inserted into the connector 100A through the opening 111A1, the extension parts 122A are brought into contact with the conductive part and are elastically bent.

FIG. 8A is a perspective view, FIG. 8B is a front view, FIG. 8C is a side view, and FIG. 8D is a plan view of the connector 410A of the FPC assembly 400 to which the connector 100A is to be connected.

The connector 410A includes a housing 411A and forty-four contacts 412A.

The housing 411A includes a base 411A1, a protrusion 411A2, guide pin holes 411A3 for guide pins, holes 411A4 for floating screws, and holes 411A5.

The base 411A1 is a base of the housing 411A. The protruding part 411A2 has a shape like a flat plate and protrudes from the base 411A1. The forty-four contacts 412A are arranged on the surfaces of the protruding part 411A2. Twenty two of the forty-four contacts 412A are arranged on one surface of the protruding part 411A2, and the remaining twenty-two contacts 412A are arranged on the other surface of the protruding part 411A2.

The protruding part 411A2 is provided separately from the base 411A1, and is fitted into a through hole of the base 411A1. The connector 410A of FIGS. 8A through 8D is formed by fitting the protruding part 411A2 into the through hole of the base 411A1 after the contacts 412A are attached to the surfaces of the protruding part 411A2.

Each contact 412A includes one signal line and two ground lines on the sides of the signal line that correspond to the signal line 125 and the ground lines 126 of the contact 120A.

A first end of the contact 412A extends up to an end of the protruding part 411A2 as illustrated by FIG. 8A, and a second end of the contact 412A extends in a direction opposite from the direction in which the protruding part 411A2 protrudes from the base 411A1 as illustrated by FIG. 8D. The first end of the contact 412A is connected to the signal line 125 and the ground lines 126 of the connector 100A, and the second end of the contact 412A is connected to the signal line and the ground lines of one of the FPCs 420.

With the above configuration, the contact 412A of the connector 410A includes a coplanar line. The contact 412A is configured as described above to achieve good impedance matching between the connector 100A and the FPCs 420, to reduce reflection and transmission loss of a signal, and to improve signal transmission characteristics.

The contact 412A of the present embodiment is an SMT (surface mount technology) contact, and may be formed by mounting a patterned metal plate on the protruding part 411A2.

The guide pin holes 411A3 receive the guide pins 112A of the connector 100A. The floating screw holes 411A4 receive screws for fastening the connector 100A and the connector 410A connected together as illustrated in FIG. 1A. The holes 411A5 accept parts for fastening the FPCs 420 to the connector 410A.

The above configuration of the connector 410A also applies to the connector 410B (see FIGS. 1A and 1B).

Figure 9A:
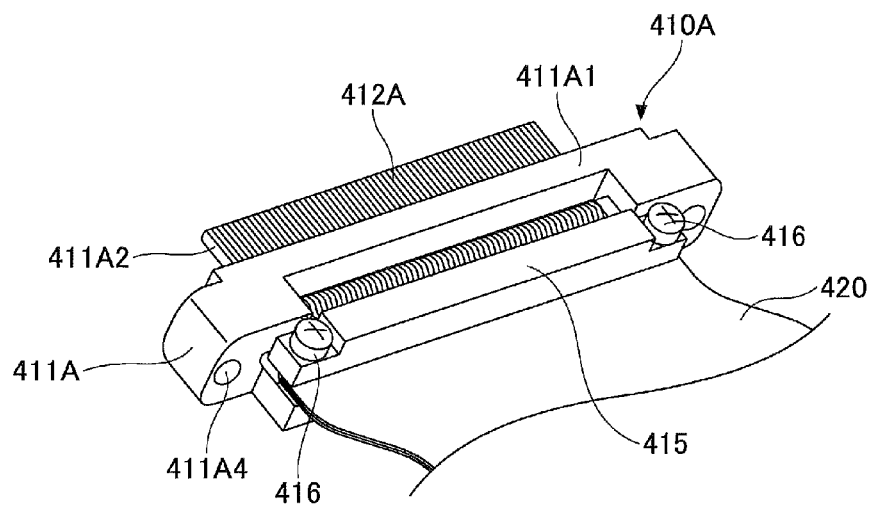
FIGS. 9A and 9B are drawings illustrating a mechanism for attaching a connector to FPCs.
Figure 9B:
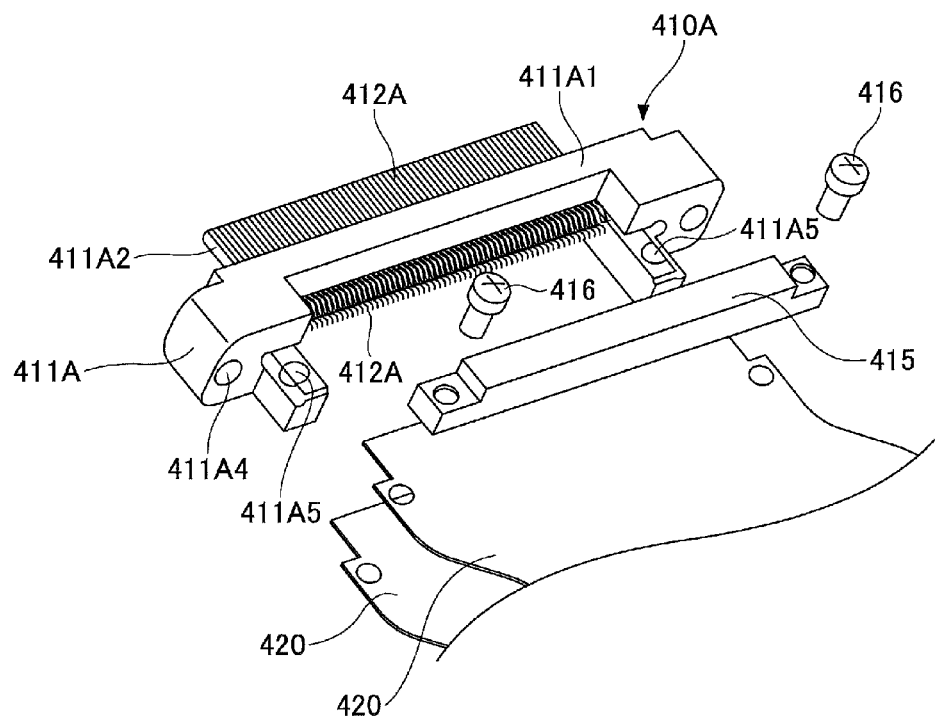

FIGS. 9A and 9B are drawings illustrating a mechanism for attaching the connector 410A to the FPCs 420. FIG. 9A is a perspective view, and FIG. 9B is an exploded view of FIG. 9A.

On a side of the connector 410A where the holes 411A5 are formed in the housing 411A, the two sets of the twenty-two contacts 412A are sandwiched between the two FPCs 420. The FPCs 420 are fixed to the housing 411A with a holder 415, and screws 416 are inserted into through holes at the ends of the holder 415 and then into the holes 411A5 of the connector 410A to attach the connector 410A to first ends of the FPCs 420 as illustrated by FIG. 9A. In this state, the signal lines and the ground lines formed on the two FPCs 420 are connected to the signal lines and the ground lines of the contacts 412A of the connector 410A.

The connector 410B has substantially the same configuration as the connector 410A, and can be attached to second ends of the FPCs 420 in a similar manner.

Figure 10:
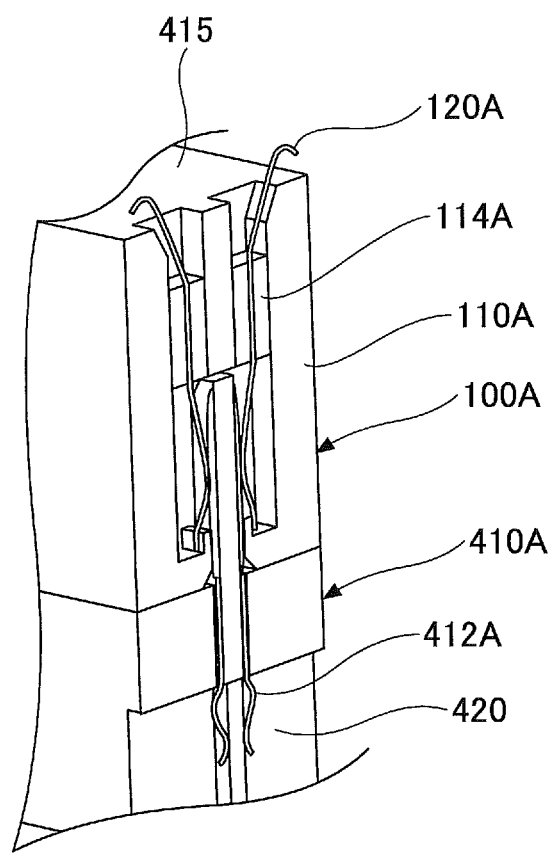
FIG. 10 is a perspective cut-away side view of connectors connected to each other.

FIG. 10 is a perspective cut-away side view of the connector 100A and the connector 410A connected together. As described above, the connector 100A includes two rows of twenty-two contacts 120A arranged to face each other, and the connector 410A includes two rows of twenty-two contacts 412A arranged to face each other. The cross section of FIG. 10 illustrates two opposing contacts 120A held in the housing 110A of the connector 100A, and two contacts 412A on the opposite surfaces of the protruding part 411A2 of the housing 411A of the connector 410A.

As illustrated by FIG. 10, the two contacts 412A on the opposite surfaces of the protruding part 411A2 of the connector 410A are sandwiched between the two contacts 120A held in the housing 110A of the connector 100A.

In this state, the two contacts 120A are pressed and caused to elastically bend by the two contacts 412A on the opposite sides of the protruding part 411A2 in directions to increase the distance between the two contacts 120A.

Also, the contacts 412A of the connector 410A are connected to the FPCs 420 on a side that is opposite from the side connected to the connector 100A. The FPCs 420 are inserted between two opposing contacts 412A. Accordingly, the two opposing contacts 412A are connected to the FPCs 420 with their leaf spring structures pressed apart from each other.

Although the board 300A (see FIG. 1A) is omitted in FIG. 10, the contacts 120A of the connector 100A are connected to the signal lines and the ground lines of the board 300A. Using the connectors 100A and 410A makes it possible to connect the board 300A and the FPCs 420 while achieving the impedance matching.

Figure 12:
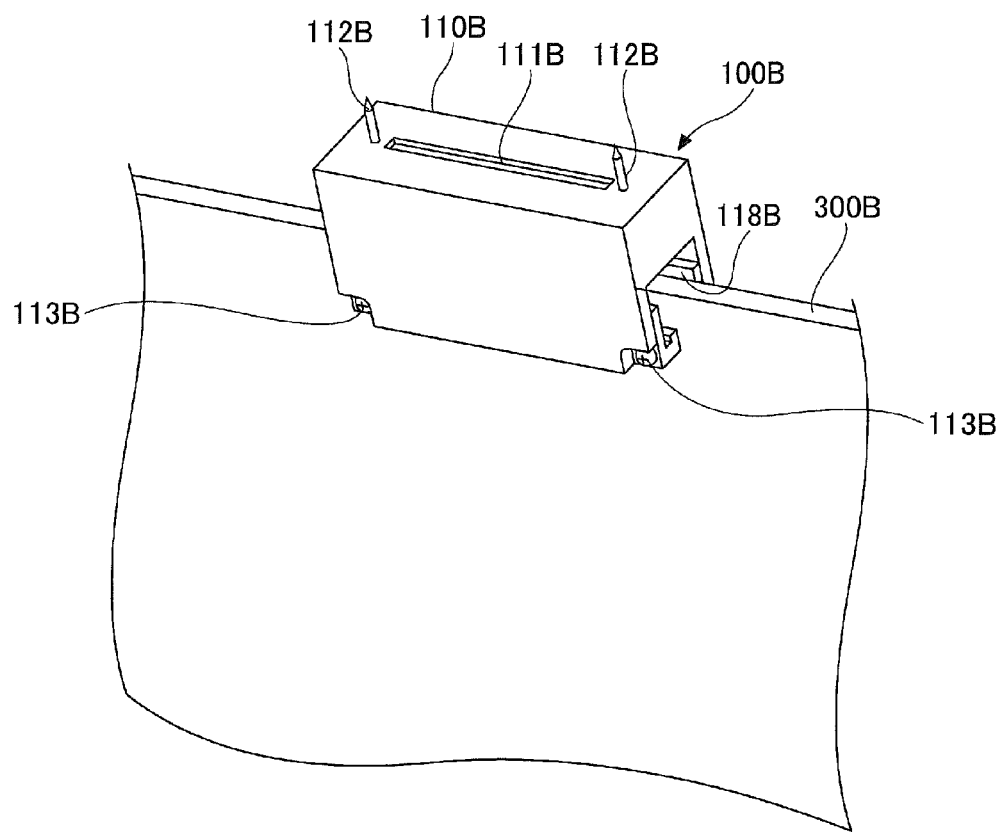
FIG. 12 is a perspective view of a connector attached to a board.

FIG. 11A is a perspective view, FIG. 11B is a front view, FIG. 11C is a side view, and FIG. 11D is a plan view of the connector 100B. FIG. 12 is a perspective view of the connector 100B attached to the board 300B.

The connector 100B includes a housing 110B and contacts 120B. The connector 100B is formed by placing the contacts 120B in a through hole 111B of the housing 110B. The housing 110B includes guide pins 112B used when the connector 410B is attached to the connector 100B. A bottom of each guide pin 112B is embedded in the housing 100B. The housing 110B also includes screws 113B and a slot 118B. The slot 118B communicates with the through hole 111B in the housing 110B, and receives the board 300B.

Through holes corresponding to the screws 113B are formed in the board 300B. An end of the board 300B is inserted into the slot 118B of the housing 110B, and the screws 113B are screwed into the through holes of the board 300B to attach the connector 100B to the end of the board 300B as illustrated by FIG. 1A and FIG. 12. For example, the guide pins 112B may be comprised of a metal such as copper or nickel, or a resin.

The housing 110B may be comprised of an insulating material such as an epoxy resin. The housing 110B has a cuboid shape.

Each contact 120B includes a first end and a second end, and has a configuration that is similar to a configuration obtained, for example, by housing the extension part 123A of the contact 120A (see FIG. 7) in the housing 110A. FIG. 11C illustrates portions of the contacts 120B to be connected to the board 300B. The portions of the contacts 120B are disposed to face each other and to contact the corresponding surfaces of the board 300B in the slot 118B. This configuration is similar to that of the contacts 120A illustrated in FIG. 7.

The first end of the contact 120B is connected to the connector 410B of the FPC assembly 400, and the second end of the contact 120B is connected to the signal line and the ground lines of the board 300B.

Figure 13:
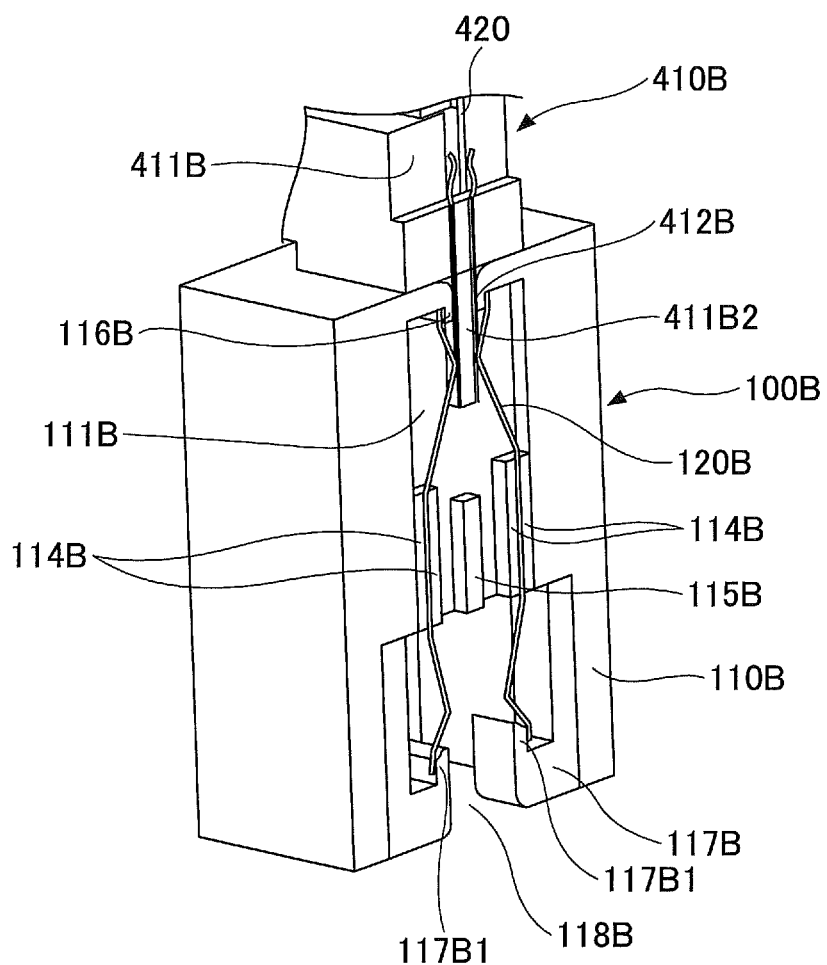
FIG. 13 is a perspective cut-away side view of connectors connected to each other.

FIG. 13 is a perspective cut-away side view of the connector 100B and the connector 410B connected to each other. The connector 100B includes two rows of twenty-two contacts 120B arranged to face each other, and the connector 410B includes two rows of twenty-two contacts 412B arranged to face each other. The cross section of FIG. 13 illustrates two opposing contacts 120B held in the housing 110B of the connector 100B, and two contacts 412B on the opposite surfaces of a protruding part 411B2 of a housing 411B of the connector 410B.

The configuration of the connector 410B is substantially the same as the configuration of the connector 410A illustrated by FIG. 8A through 9B. Therefore, components of the connector 410B are indicated by reference numbers that are obtained by replacing "A" in the reference numbers of the corresponding components of the connector 410A with "B".

Similarly to the contact 120A (see FIG. 10), the contact 120B is held by a holder 114B and is fitted into a gap between a partition wall 115B in the housing 110B and the inner wall of the housing 110B.

The housing 110B includes two engaging parts 116B that are similar to the engaging parts 116A of the housing 110A.

When the contacts 120B bound by the holder 114B are inserted into the through hole 111B and the holder 114B is fitted into the gap between the inner wall of the housing 110B and the partition wall 115B, the first end of each contact 120B engages with the corresponding engaging part 116B.

The housing 110B also includes lids 117B on the side of the slot 118B of the through hole 111B. Each of the lids 117B includes an engaging part 117B1. The engaging parts 117B1 are located inside of the slit 118B and have a configuration similar to that of the engaging parts 116B.

When the contacts 120B bound by the holder 114B are inserted into the through hole 111B and the holder 114B is fitted into the gap between the inner wall of the housing 110B and the partition wall 115B, the second end of each contact 120B engages with the corresponding engaging part 117B1.

The lids 117B are removed from the housing 110B when the two sets of the contacts 120B bound by the holder 114B are inserted into the through hole 111B of the housing 110B, and are attached to the housing 110B after the two sets of the contacts 120B are inserted into the through hole 111B. When the lids 117B are attached, the second ends of the contacts 120B engage with the engaging parts 117B1.

With the first end of the contact 120B engaging with the engaging part 116B, the second end of the contact 120B engaging with the engaging part 117B1, and the holder 114B holding the base 121B fitted into the gap between the inner wall of the housing 110B and the partition wall 115B, the contact 120B can function as a leaf spring.

As illustrated by FIG. 13, the two contacts 412B on the opposite surfaces of the protruding part 411B2 of the connector 410B are sandwiched between the two contacts 120B held in the housing 110B of the connector 100B.

In this state, the two contacts 120B are pressed and caused to elastically bend by the two contacts 412B on the opposite sides of the protruding part 411132 in directions to increase the distance between the two contacts 120B.

Also, the contacts 412B of the connector 410B are connected to the FPCs 420 on a side that is opposite from the side connected to the connector 100B. The FPCs 420 are inserted between two opposing contacts 412B. Accordingly, the two opposing contacts 412B are connected to the FPCs 420 with their leaf spring structures pressed apart from each other.

Although the board 300B (see FIG. 12) is omitted in FIG. 13, the contacts 120B of the connector 100B are connected to the signal lines and the ground lines of the board 300B. Using the connectors 100B and 410B makes it possible to connect the board 300B and the FPCs 420 while achieving the impedance matching.

As described above, by using the connector 100A including the contacts 120A and the connector 100B including the contacts 120B of the present embodiment, it is possible to connect the connector 100A and the connector 410A and connect the connector 100B and the connector 410B while achieving the impedance matching.

That is, the present embodiment makes it possible to connect the board 300A and the FPCs 420 and connect the board 300 and the FPCs 420 while achieving the impedance matching.

An aspect of this disclosure provides the connectors 100A and 100B and the contacts 120A and 120B that make it possible to transmit a signal in an impedance matched condition.

Connectors and contacts according to embodiments of the present invention are described above. However, the present invention is not limited to the specifically disclosed embodiments, and variations and modifications may be made without departing from the scope of the present invention.

What is claimed is:

1. A connector to be connected to a signal wire and a ground wire formed on a board, the connector comprising:
    a housing to be attached to the board;
    a ground terminal including
        a base that is disposed in the housing,
        three first extension parts that extend from the base toward a first end of the housing, including a first middle extension part, and first side extension parts each of which is provided on a side of the first middle extension part, respectively, and
        three second extension parts that extend from the base toward a second end of the housing, including a second middle extension part, and second side extension parts each of which is provided on a side of the second middle extension part, respectively, the second extension parts being configured to contact a surface of the board and to be elastically bent when the housing is attached to the board;
    an insulating layer formed on a surface of the ground terminal;
    a signal line that is formed on the insulating layer and extends from an end of the first middle extension part to an end of the second middle extension part, the signal line is connected to the signal wire of the board when the housing is attached to the board; and
    ground lines that are formed on the insulating layer, are electrically connected to the ground terminal, and each extends from an end of one of the first side extension parts to an end of one of the second side extension parts, each of the ground lines is connected to the ground wire of the board when the housing is attached to the board.

2. The connector as claimed in claim 1, wherein the first extension parts are configured such that when another connector is connected to the connector, the signal line and the ground lines formed on the first extension parts are connected to a signal wire and a ground wire of the other connector, respectively.

3. The connector as claimed in claim 1, wherein the signal line is implemented by a first plated layer formed on the insulating layer.

4. The connector as claimed in claim 1, wherein
    each of the ground lines is implemented by a second plated layer formed on the insulating layer; and
    the second plated layer is connected to the ground terminal via a groove that passes through the insulating layer in a thickness direction.

5. The connector as claimed in claim 1, wherein
    the connector comprises a plurality of ground terminals; and
    the connector further comprises a holder that holds the ground terminals to bind the ground terminals together.

6. A contact to be connected to a signal wire and a pair of ground wires formed on a board, the contact comprising:
    a ground terminal including
        a base that includes a first end and a second end,
        three first extension parts that extend from the first end of the base and include a first middle extension part and first side extension parts on sides of the first middle extension part, and
        three second extension parts that extend from the second end of the base and include a second middle extension part and second side extension parts on sides of the second middle extension part, the second extension parts being configured to contact a surface of the board and to be elastically bent when the contact is connected to the board;
    an insulating layer formed on a surface of the ground terminal;
    a signal line that is formed on the insulating layer and extends from an end of the first middle extension part to an end of the second middle extension part, wherein when the contact is connected to the board, the signal line on the second middle extension part is connected to the signal wire of the board and the second extension parts are elastically bent; and
    a pair of ground lines that are formed on the insulating layer, are connected to the ground terminal, and extend from ends of the first side extension parts to ends of the second side extension parts, wherein when the contact is connected to the board, the ground lines on the second side extension parts are connected to the ground wires of the board and the second extension parts are elastically bent.

7. A connector to be connected to a signal wire and a ground wire formed on a board, the connector comprising:
   a terminal including
      a base made of a conductive material,
      at least two first extension parts that extend from the base toward a first end of the connector, and
      at least two second extension parts that extend from the base toward a second end of the connector;
   an insulating layer formed on a surface of the terminal;
   a signal line that is formed on the insulating layer, is insulated from the terminal, and extends from an end of a first one of the first extension parts to an end of a first one of the second extension parts, the signal line being connected to the signal wire of the board when the connector is attached to the board; and
   a ground line that is formed on the insulating layer, is electrically connected to the terminal, and extends from an end of a second one of the first extension parts, which is adjacent to the first one of the first extension parts, to an end of a second one of the second extension parts, which is adjacent to the first one of the second extension parts, the ground line being connected to the ground wire of the board when the connector is attached to the board.

* * * * *